United States Patent
Yang et al.

(10) Patent No.: US 12,476,647 B2
(45) Date of Patent: Nov. 18, 2025

(54) ANALOG-TO-DIGITAL CONVERTER

(71) Applicants: SK hynix Inc., Icheon (KR); Sogang University Research and Business Development Foundation, Seoul (KR)

(72) Inventors: Sunghun Yang, Seoul (KR); Jaehun Jeong, Seoul (KR); Youngwon Cho, Seoul (KR); Jinwook Burm, Goyang (KR)

(73) Assignees: SK hynix Inc., Icheon (KR); Sogang University Research and Business Development Foundation, Seoul (KR)

( * ) Notice: Subject to any disclaimer, the term of this patent is extended or adjusted under 35 U.S.C. 154(b) by 166 days.

(21) Appl. No.: 18/482,804

(22) Filed: Oct. 6, 2023

(65) Prior Publication Data
US 2024/0413832 A1  Dec. 12, 2024

(30) Foreign Application Priority Data
Jun. 9, 2023  (KR) .................. 10-2023-0073965

(51) Int. Cl.
*H03M 1/06* (2006.01)
*H03M 1/36* (2006.01)
*H03M 1/50* (2006.01)

(52) U.S. Cl.
CPC ......... *H03M 1/0687* (2013.01); *H03M 1/368* (2013.01); *H03M 1/50* (2013.01)

(58) Field of Classification Search
CPC .... H03M 1/368; H03M 1/466; H03M 1/0697; H03M 1/1245
See application file for complete search history.

(56) References Cited

U.S. PATENT DOCUMENTS

| | | | | |
|---|---|---|---|---|
| 5,736,953 A * | 4/1998 | Yamaguchi | ........... | H03M 1/002 341/163 |
| 6,028,545 A * | 2/2000 | Chen | ..................... | H03M 1/144 341/164 |
| 8,264,393 B2 * | 9/2012 | Garrity | ................ | H03M 1/162 341/163 |
| 8,907,833 B1 * | 12/2014 | Zhou | ..................... | H03M 1/124 341/161 |
| 10,218,377 B2 | 2/2019 | Bogner | | |
| 10,454,492 B1 * | 10/2019 | Shikata | ................ | H03M 1/466 |
| 10,530,382 B2 * | 1/2020 | Kong | .................... | H03M 1/468 |
| 10,812,098 B1 * | 10/2020 | Vishweshwara | ...... | H03M 1/466 |

(Continued)

OTHER PUBLICATIONS

Sang-Hyun Cho et al., "A 550uW 10-b 40-MS/s SAR ADC Wirth Multistep Addition-Only Digital Error Correction", IEEE Journal of solid-state circuits, vol. 46, No. 8, Aug. 2011, pp. 1881-1892.

*Primary Examiner* — Lam T Mai

(57) ABSTRACT

An analog-to-digital converter includes a comparator configured to compare an input voltage and a conversion voltage and to generate a comparison result; a digital-to-analog converter configured to generate the conversion voltage according to a digital output signal; and a control circuit including a conversion control circuit configured to determine the digital output signal corresponding to the input voltage based on the comparison result; and a correction control circuit configured to correct an error of the digital output signal by increasing or decreasing the digital output signal based on the comparison result after the digital output signal is determined.

13 Claims, 5 Drawing Sheets

(56) References Cited

U.S. PATENT DOCUMENTS

| | | | | |
|---|---|---|---|---|
| 10,886,933 | B1* | 1/2021 | Ghosh | H03M 1/164 |
| 2004/0196168 | A1* | 10/2004 | Ho | H03M 3/496 |
| | | | | 341/143 |
| 2011/0102219 | A1* | 5/2011 | Jeong | H03M 1/46 |
| | | | | 341/122 |
| 2016/0056830 | A1* | 2/2016 | Malik | H03M 1/0612 |
| | | | | 341/158 |
| 2016/0254821 | A1* | 9/2016 | Luo | H03K 5/2481 |
| | | | | 341/161 |
| 2017/0012639 | A1* | 1/2017 | Bogner | H03M 1/468 |
| 2017/0126243 | A1* | 5/2017 | Liu | H03M 1/1245 |
| 2019/0081636 | A1* | 3/2019 | Chen | H03M 1/002 |
| 2020/0136640 | A1* | 4/2020 | Chuang | H03M 1/462 |
| 2020/0162091 | A1* | 5/2020 | Huang | H03M 1/0607 |
| 2020/0195269 | A1* | 6/2020 | Lei | H03M 1/468 |
| 2020/0328753 | A1* | 10/2020 | Huang | H03M 1/462 |
| 2021/0119638 | A1* | 4/2021 | Ghosh | H03M 1/164 |
| 2021/0376844 | A1 | 12/2021 | Wang et al. | |
| 2022/0224349 | A1* | 7/2022 | Varshney | H03M 1/50 |
| 2023/0147156 | A1* | 5/2023 | Fajarmega | H03M 1/462 |
| | | | | 341/155 |
| 2023/0221747 | A1* | 7/2023 | Lee | G05F 1/575 |
| | | | | 341/161 |
| 2023/0378972 | A1* | 11/2023 | Lin | H03M 1/462 |
| 2024/0313797 | A1* | 9/2024 | Veytsman | H03M 1/38 |

* cited by examiner

ANALOG-TO-DIGITAL CONVERTER

CROSS-REFERENCE TO RELATED APPLICATION

The present application claims priority under 35 U.S.C. § 119 (a) to Korean Patent Application No. 10-2023-0073965, filed on Jun. 9, 2023, which is incorporated herein by reference in its entirety.

BACKGROUND

1. Technical Field

Various embodiments generally relate to an analog-to-digital converter, and more specifically, to an analog-to-digital converter capable of reducing an analog-to-digital conversion error.

2. Related Art

FIG. 1 is a block diagram showing a conventional 4-bit successive approximation (SAR) analog-to-digital converter (ADC) 1.

The conventional 4-bit SAR ADC 1 includes a sample and hold circuit 10, a comparator 20, a conversion control circuit 30, and a digital-to-analog converter (DAC) 40.

The sample and hold circuit 10 samples and stores an input voltage VIN, and the comparator 20 compares an output voltage of the sample and hold circuit 10 with a conversion voltage VDAC output from the DAC 40 and outputs a comparison result to the conversion control circuit 30.

The conversion control circuit 30 sequentially determines a digital output signal DOUT from the most significant bit (MSB) to the least significant bit (LSB) thereof with reference to the comparison result, according to a clock signal CLK. When the LSB of the digital output signal DOUT is determined, an end signal (EOC) is activated.

The DAC 40 generates the conversion voltage VDAC corresponding to the digital output signal DOUT.

FIG. 2 is a waveform diagram showing a problem of the conventional 4-bit SAR ADC 1 shown in FIG. 1.

The conventional 4-bit SAR ADC 1 sequentially performs conversion operations from Phase 1 to Phase 4 to determine values from the MSB to the LSB of the digital output signal DOUT. Accordingly, the conversion voltage VDAC output from the DAC 40 has the largest swing width at an initial stage of the conversion operations.

When the swing width is large, the DAC 40 may not generate the conversion voltage VDAC, which corresponds to the digital output signal DOUT, normally due to lack of settling time. This may cause a settling error at the initial stage.

FIG. 2 shows that due to this settling error, the MSB of the digital output signal DOUT is determined incorrectly, resulting in a real value for the digital output signal DOUT that differs from an ideal value.

SUMMARY

In accordance with an embodiment of the present disclosure, an analog-to-digital converter may include a comparator configured to compare an input voltage and a conversion voltage and to generate a comparison result; a digital-to-analog converter configured to generate the conversion voltage according to a digital output signal; and a control circuit including a conversion control circuit configured to determine the digital output signal corresponding to the input voltage based on the comparison result; and a correction control circuit configured to correct an error of the digital output signal by increasing or decreasing the digital output signal based on the comparison result after the digital output signal is determined.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
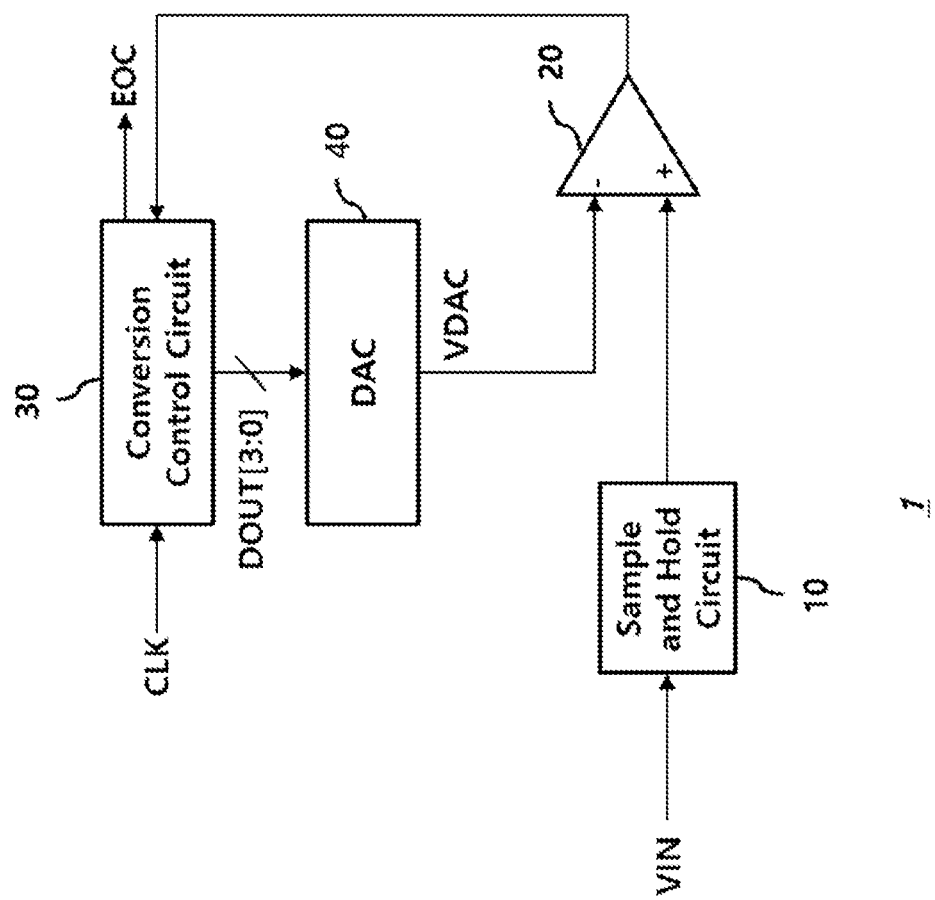
FIG. 1 illustrates a conventional analog-to-digital converter.
Figure 2:
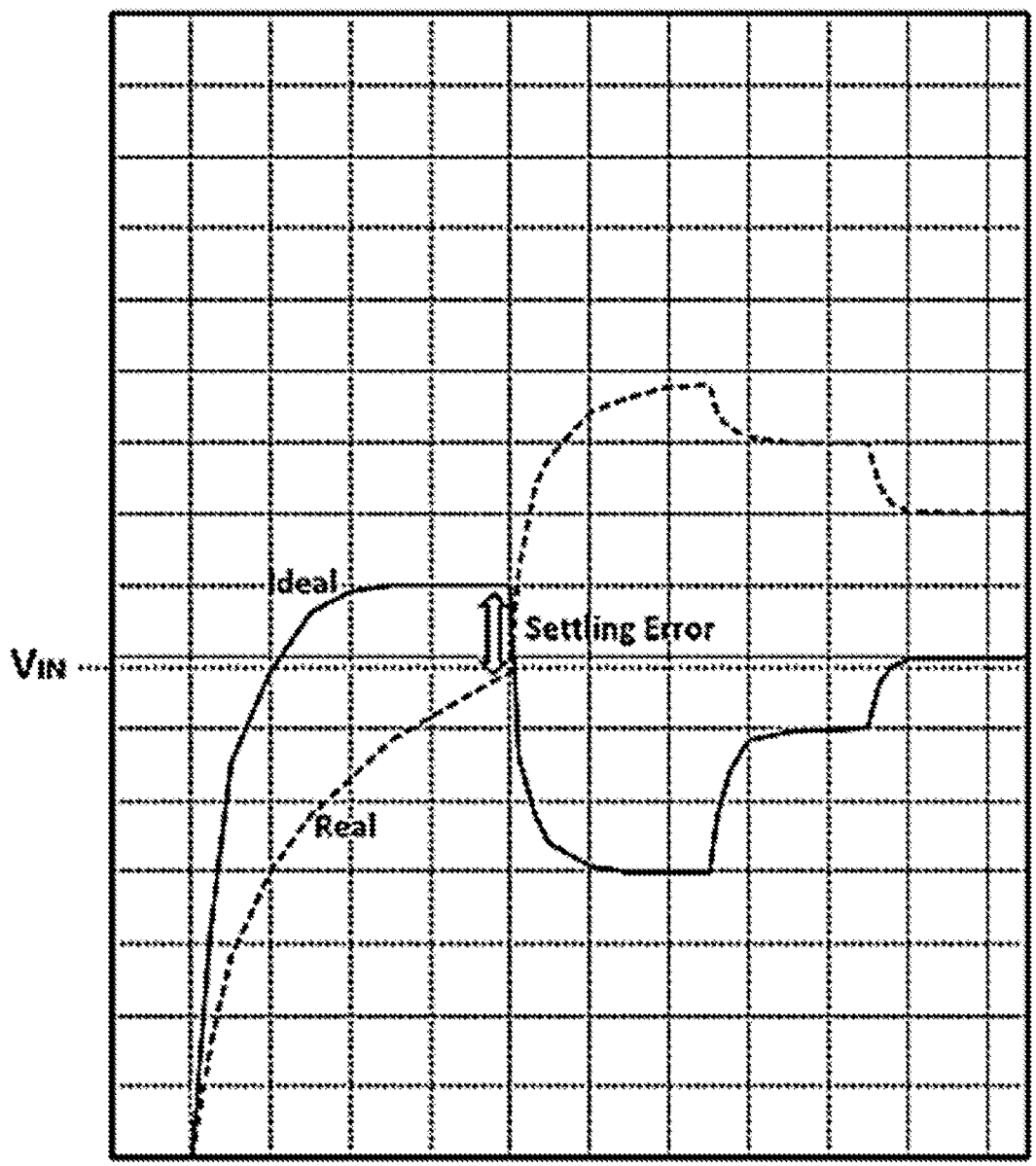
FIG. 2 is a waveform diagram showing a problem of the conventional analog-to-digital converter illustrated in FIG. 1.
Figure 3:
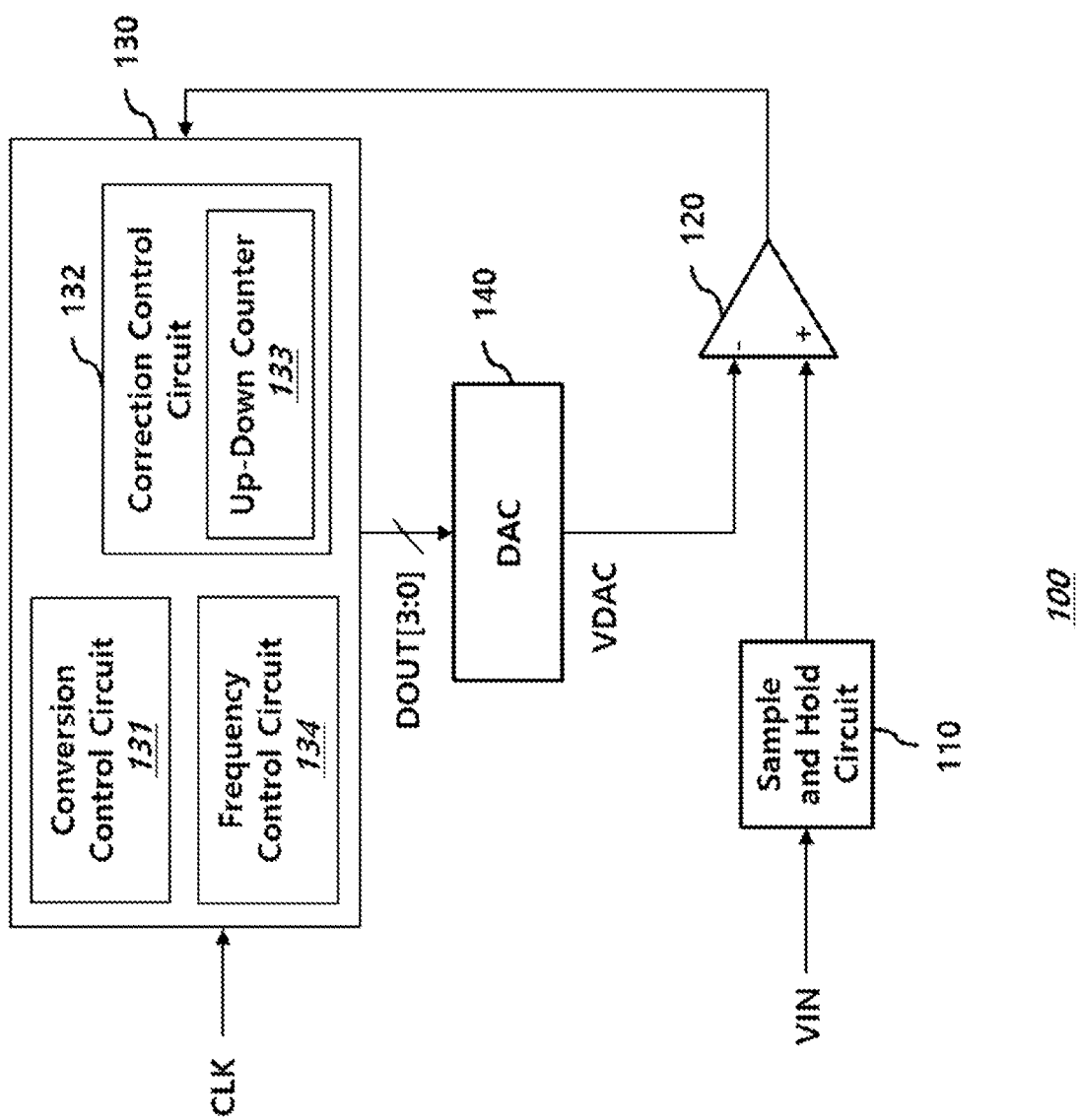
FIG. 3 illustrates an analog-to-digital converter according to an embodiment of the present disclosure.

FIG. 3 illustrates an analog-to-digital converter (ADC) 100 according to an embodiment of the present disclosure.

In this embodiment, the ADC 100 is a 4-bit successive approximation (SAR) ADC. However, embodiments are not limited to the 4-bit SAR ADC.

The ADC 100 includes a sample and hold circuit 110, a comparator 120, a control circuit 130, and a digital-to-analog converter (DAC) 140.

The sample and hold circuit 110 samples and stores the input voltage VIN, and the comparator 120 compares an output voltage of the sample and hold circuit 10 with a conversion voltage VDAC output from the DAC 140 to output a comparison result.

The DAC 140 generates the conversion voltage VDAC that corresponds to a digital output signal DOUT output from the control circuit 130.

The control circuit 130 includes a conversion control circuit 131 that determines the digital output signal DOUT by referring to the comparison result according to a clock signal CLK, and further includes a correction control circuit 132 that corrects an error of the digital output signal DOUT.

The conversion control circuit 131 sequentially determines the digital output signal DOUT from the most significant bit (MSB) to the least significant bit (LSB) with reference to the comparison result according to the clock signal CLK.

In this embodiment, the correction control circuit 132 operates after all bits of the digital output signal DOUT are determined through a conversion operation of the conversion control circuit 131.

The correction control circuit 132 increases or decreases the LSB of the digital output signal DOUT by referring to a result of comparing the conversion voltage VDAC output when the digital output signal DOUT is provided to the DAC 140 with the output voltage of the sample and hold circuit 110. For example, if the conversion voltage VDAC is less than the output voltage of the sample and hold circuit 110, the LSB of the digital output signal DOUT is increased.

In this case, the number of increments or decrements of the LSB may vary depending on embodiments.

Figure 4:
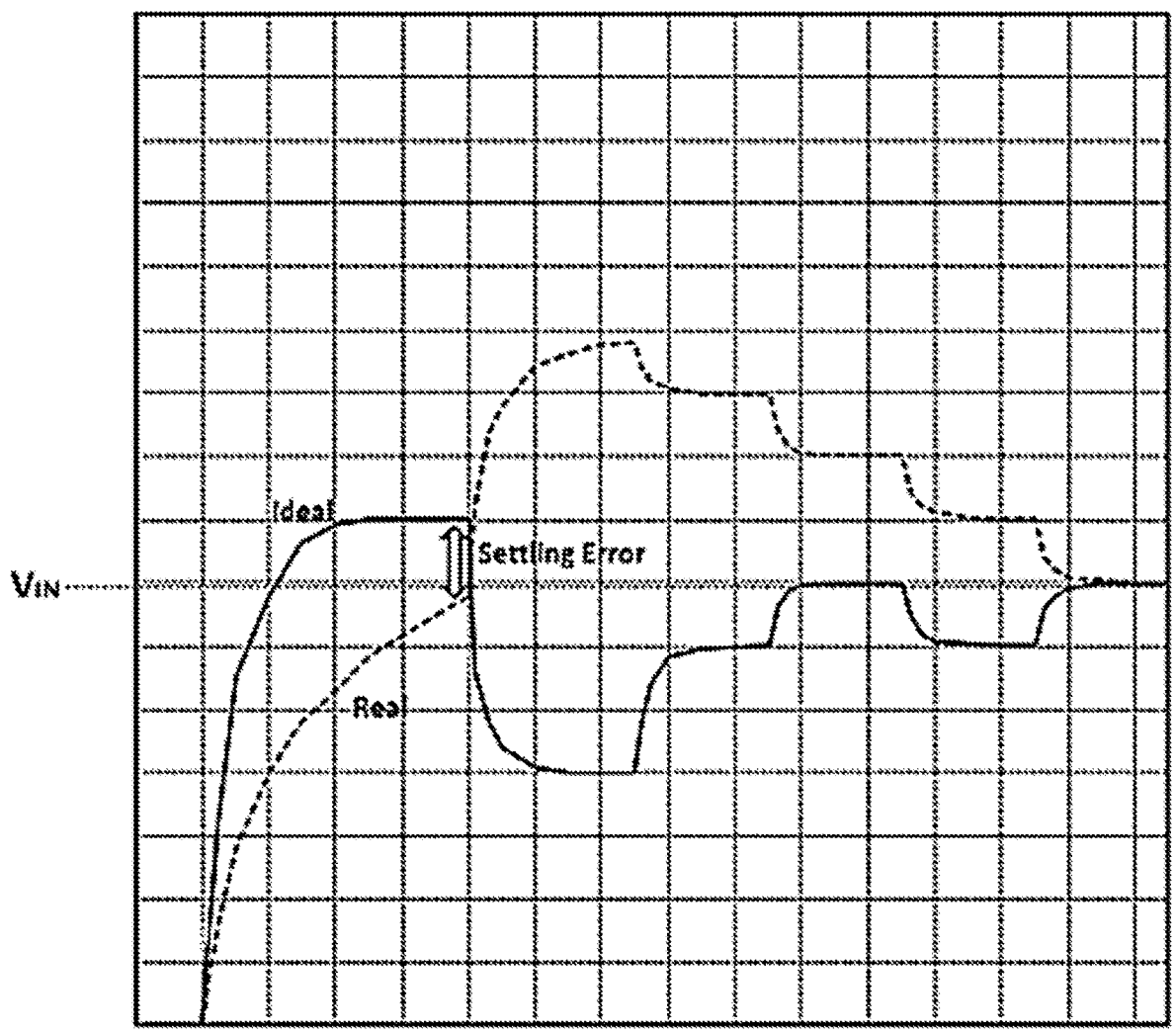
FIG. 4 is a waveform diagram showing an operation of the analog-to-digital converter illustrated in FIG. 3.

FIG. 4 is a waveform diagram showing an operation of the ADC 100 illustrated in FIG. 3.

In FIG. 4, Phase 1 to Phase 4 represent steps for determining the 4-bit digital output signal DOUT. As in the prior art, in Phase 1, an error may occur depending on operating conditions of the DAC 140.

FIG. 4 shows that an ideal value of the digital output signal DOUT that corresponds to the input voltage VIN should be "0110," but a real value, "1000," is output because the error occurred in Phase 1.

In the present embodiment, the correction control circuit 132 performs a correction operation in each of Phase 5 and Phase 6 by sequentially increasing or decreasing the LSB of the digital output signal DOUT.

FIG. 4 shows a process of generating "0110," which is a final value of the digital output signal DOUT and is the same as an ideal value, by decreasing the LSB by 1 in each of Phase 5 and Phase 6.

Referring back to FIG. 3, the correction control circuit 132 may include an up-down counter 133 to increase or decrease the LSB of the digital output signal DOUT.

The up-down counter 133 may operate in such a way that a counter value thereof is initialized by the digital output signal DOUT and the counter value is increased or decreased based on the comparison result output from the comparator 120.

The control circuit 130 may further include a frequency control circuit 134.

The frequency control circuit 134 may change and provide a frequency of the clock signal CLK for internal operations. The frequency control circuit 134 may receive a plurality of clock signals having different frequencies, select a clock signal having an appropriate frequency from among the plurality of clock signals, and provide a selected clock signal for an internal operation. Various design changes thereto are possible to a person skilled in the art.

Hereinafter, a clock signal provided by the frequency control circuit 134 for an internal operation is referred to as an internal clock signal.

In an embodiment, the operations of the conversion control circuit 131 and the correction control circuit 132 may be controlled by internal clock signals of the same frequency, but, in another embodiment, their operations may be controlled by internal clock signals of different frequencies.

For example, the conversion control circuit 131 may operate according to a first internal clock signal, and the correction control circuit 132 may operate according to a second internal clock signal having a higher frequency than the first internal clock signal.

As another example, the conversion control circuit 131 operates according to the first internal clock signal while determining upper bits of the digital output signal DOUT, and operates according to the second internal clock signal having a higher frequency than the first internal clock signal while determining lower bits of the digital output signal DOUT.

Since a relatively large voltage fluctuates in the DAC 140 when determining the upper bits, the possibility of an error occurring due to an insufficient settling time of the DAC 140 can be reduced by using the first internal clock signal having a lower frequency. In addition, since a relatively low voltage in the DAC 140 fluctuates when determining the lower bits, the overall conversion time can be reduced by using the second internal clock signal with a higher frequency.

In another embodiment, internal clock signals having three or more different frequencies may be used according to locations of bits in the digital output signal DOUT while determining the digital output signal DOUT, and various design changes thereto may be made by a person skilled in the art.

Figure 5:
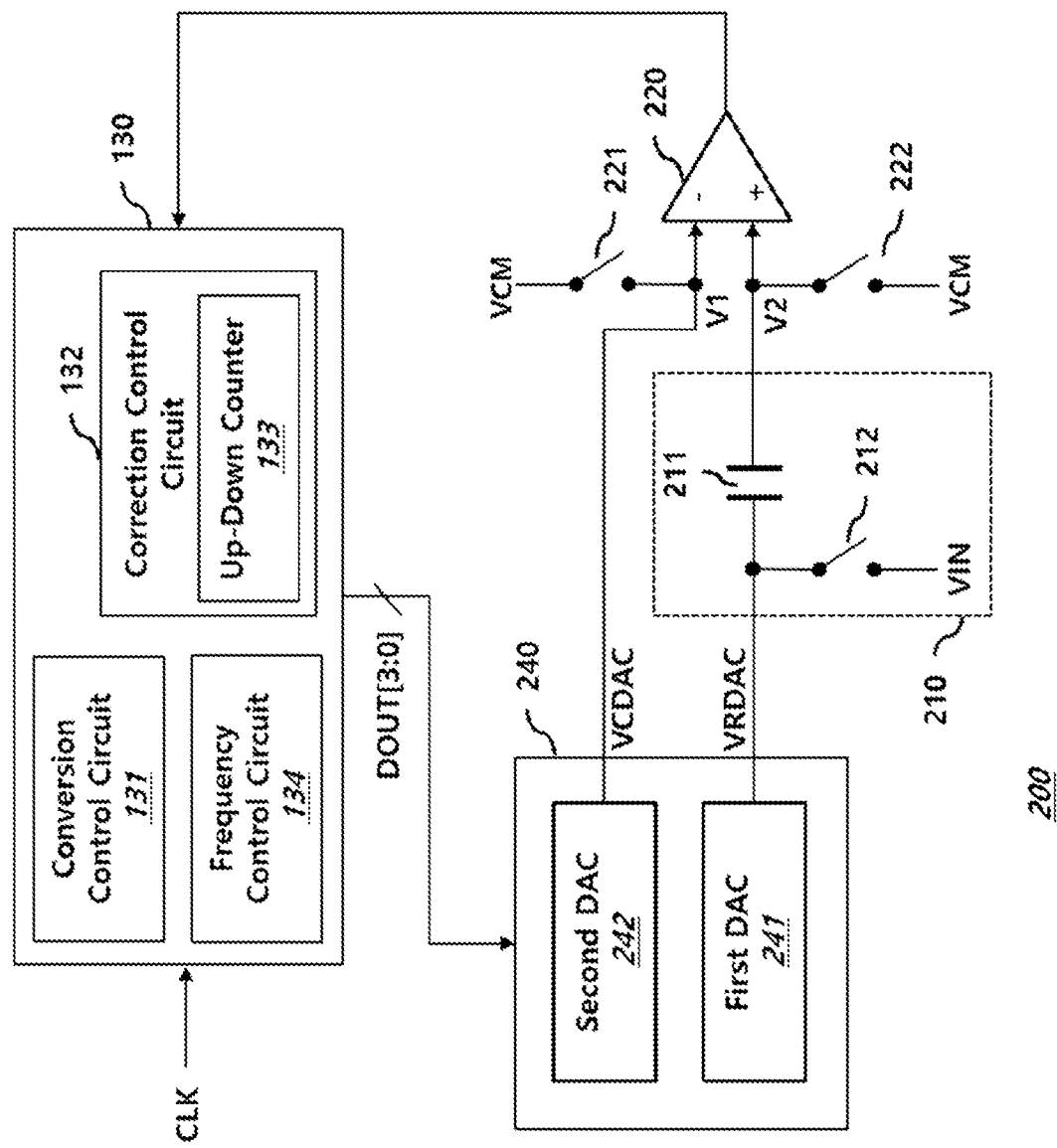
FIG. 5 illustrates an analog-to-digital converter according to another embodiment of the present disclosure.

FIG. 5 is a block diagram showing an ADC 200 according to another embodiment of the present disclosure.

Referring to FIG. 5, the ADC 200 includes a control circuit 130, a DAC 240, a sample and hold circuit 210, and a comparator 220. The control circuit 130 of the ADC 200 is substantially the same as the control circuit 130 shown in FIG. 3, and thus the same reference numerals are used in FIG. 5.

The DAC 240 includes a first DAC 241 and a second DAC 242.

In this embodiment, the first DAC 241 is a resistor-type DAC that is used in a process of determining upper bits of a digital output signal DOUT, and the second DAC 242 is a capacitor-type DAC that converts the digital output signal DOUT and is used in a process of determining lower bits of the digital output signal DOUT.

For example, when the digital output signal DOUT has 4 bits, the first DAC 241 is used in a process of determining upper 2 bits that are DOUT[3] and DOUT[2], and the second DAC 242 is used in a process of determining lower 2 bits that are DOUT[1] and DOUT[0]. In the control circuit 130, a frequency of an internal clock signal when using the first DAC 241 may be lower than a frequency of an internal clock signal when using the second DAC 242.

Hereinafter, the step of determining the upper bits of the digital output signal DOUT using the first DAC 241 is referred to as a first conversion step, and the step of determining the lower bits of the digital output signal DOUT using the second DAC 242 is referred to as a second conversion step.

Since a structure of each of the resistor-type DAC and the capacitor-type DAC is well known in the art, a detailed description thereof will be omitted.

The sample and hold circuit 210 includes a sampling capacitor 211 and a sampling switch 212 connected to a first terminal of the sampling capacitor 211 to provide an input voltage VIN to the first terminal of the sampling capacitor 211. A second terminal of the sampling capacitor 211 is connected to a positive input terminal of the comparator 220.

An output voltage of the first DAC 241 is referred to as a first conversion voltage VRDAC, and an output voltage of the second DAC 242 is referred to as a second conversion voltage VCDAC.

The first DAC 241 is connected to the first terminal of the sampling capacitor 211.

The second DAC 242 is connected to a negative input terminal of the comparator 220.

The positive and negative input terminals of the comparator 220 are connected to a common voltage VCM through switches 221 and 222, respectively.

The operation of the ADC 200 will be described using an example where the input voltage VIN ranges between 0V and 1V and the common voltage VCM has 0.5V, as follows.

(Sampling Step)

In the sampling step, the switch 212 is turned on to apply the input voltage VIN to the sampling capacitor 211 in the sample and hold circuit 210, and a negative input voltage V1 at the negative input terminal of the comparator 220 and a positive input voltage V2 at the positive input terminal of the comparator 220 are fixed to the common voltage VCM through the switches 221 and 222 that are turned on.

(First Conversion Step)

In the first conversion step, the switch 222 is turned off and the first conversion voltage VRDAC generated by the first DAC 241 according to the digital output signal DOUT is provided to the first terminal of the sampling capacitor 211. The positive input voltage V2 of the comparator 220 has a value determined by Equation 1 below, and the negative input voltage V1 of the comparator 220 is fixed to the common voltage VCM through the switch 221 that is turned on.

$$V2 = VRDAC + VCM - VIN \quad [\text{Equation 1}]$$

Accordingly, in the first conversion step, the comparator 220 compares magnitudes of the input voltage VIN and the first conversion voltage VRDAC and outputs a comparison result.

The upper bits of the digital output signal DOUT are determined by repeating the first conversion step for the remaining upper bits.

(Second Conversion Step)

In the second conversion step, the switch 221 is turned off and the second conversion voltage VCDAC generated by the second DAC 242 according to the digital output signal DOUT is provided to the negative input terminal of the comparator 220 and accordingly, the negative input voltage V1 of the comparator 220 has a value determined by Equation 2 below, and the positive input voltage V2 of the comparator 220 has a value determined by Equation 3 below. In Equation 3, the first conversion voltage VRDAC is maintained as a value finally determined in the first conversion step.

$$V1 = VCDAC \quad [\text{Equation 2}]$$

$$V2 = VRDAC + VCM - VIN \quad [\text{Equation 3}]$$

This reflects the change in the voltage of the sampling capacitor 211 according to the determination of the digital output signal DOUT in the ADC 200 using the capacitor-type DAC 242.

The digital output signal DOUT is determined by repeating the second conversion step for the remaining lower bits.

In a correction operation, the LSB of the digital output signal DOUT may be increased or decreased using the second DAC 242, which is substantially the same as the aforementioned embodiment in FIG. 3.

In the case of a multi-channel ADC generating a plurality of digital output signals for a plurality of input voltages, a plurality of ADCs, each as depicted in FIG. 5, may be arranged in parallel for each channel.

In this case, the resistance-type first DAC 241 can be shared by the plurality of ADCs 200, and through this, an area occupied by the plurality of ADCs 200 can be saved.

Although various embodiments have been illustrated and described, various changes and modifications may be made to the described embodiments without departing from the spirit and scope of the invention as defined by the following claims.

What is claimed is:

1. An analog-to-digital converter (ADC) comprising:
   a comparator configured to compare an input voltage and a conversion voltage and to generate a comparison result;
   a digital-to-analog converter (DAC) configured to generate the conversion voltage according to a digital output signal; and
   a control circuit including:
   a conversion control circuit configured to determine the digital output signal corresponding to the input voltage based on the comparison result; and
   a correction control circuit configured to correct an error of the digital output signal by increasing or decreasing a least significant bit (LSB) of the digital output signal based on the comparison result after the digital output signal is determined.

2. The ADC of claim 1, wherein the correction control circuit includes an up-down counter that is initialized by the digital output signal and increases or decreases the LSB of the digital output signal based on the comparison result.

3. The ADC of claim 1, wherein the conversion control circuit operates according to a first internal clock signal having a first frequency, and the correction control circuit operates according to a second internal clock signal having a second frequency that is higher than the first frequency.

4. The ADC of claim 1, wherein the conversion control circuit sequentially determines the digital output signal from a most significant bit (MSB) to the least significant bit (LSB) of the digital output signal according to an internal clock signal,
   wherein a frequency of the internal clock signal when the MSB is determined is lower than a frequency of the internal clock signal when the LSB is determined.

5. The ADC of claim 1, further comprising a sample and hold circuit configured to sample and store the input voltage.

6. The ADC of claim 5, wherein the comparator includes a positive input terminal receiving an output of the sample and hold circuit and a negative input terminal receiving the conversion voltage.

7. The ADC of claim 1, wherein the DAC includes a first DAC and a second DAC,
   wherein the first DAC provides, as the conversion voltage, a first conversion voltage generated to correspond to the digital output signal when determining upper bits of the digital output signal, and
   wherein the second DAC provides, as the conversion voltage, a second conversion voltage generated to correspond to the digital output signal when determining lower bits of the digital output signal.

8. The ADC of claim 7, wherein the conversion control circuit sequentially determines the digital output signal from a MSB to the LSB according to an internal clock signal,
   wherein a frequency of the internal clock signal when using the first DAC is lower than a frequency of the internal clock signal when using the second DAC.

9. The ADC of claim 7, further comprising a sample and hold circuit configured to sample and store the input voltage.

10. The ADC of claim 9, wherein the sample and hold circuit includes a sampling capacitor and a switch, the sampling capacitor having a first terminal receiving the first conversion voltage and a second terminal coupled to a negative input terminal of the comparator, the switch selectively providing the input voltage to the first terminal of the sampling capacitor, and wherein the second conversion voltage is provided to a positive input terminal of the comparator.

11. The ADC of claim 10, wherein when the sample and hold circuit samples the input voltage, the positive input terminal and the negative input terminal of the comparator are fixed to a common voltage.

12. The ADC of claim 11, wherein the first DAC performs a first conversion operation and the second DAC performs a second conversion operation, wherein in the first conversion operation, the first conversion voltage is provided to the first terminal of the sampling capacitor, and a negative input voltage at the negative input terminal of the comparator is determined as follows:

$$V2=VRDAC+VCM-VIN,$$

where V2 is the negative input voltage, VRDAC is the first conversion voltage, VCM is the common voltage, and VIN is the input voltage, and a positive input voltage at the positive input terminal of the comparator is fixed to the common voltage.

13. The ADC of claim 12, wherein in the second conversion operation, the first conversion voltage is provided to the first terminal of the sampling capacitor, and the negative input voltage is determined as follows:

$$V2=VRDAC+VCM-VIN, \text{ and}$$

the second conversion voltage is provided to the positive input terminal of the comparator so that the positive input voltage is determined as follows:

$$V1=VCDAC,$$

where V1 is the positive input voltage, and VCDAC is the second conversion voltage.

* * * * *